(12) United States Patent
Wang et al.

(10) Patent No.: US 9,356,076 B2
(45) Date of Patent: May 31, 2016

(54) ORGANIC LIGHT EMITTING DIODE DISPLAY INCLUDING SENSORS

(71) Applicant: SAMSUNG DISPLAY CO., LTD., Yongin, Gyeonggi-Do (KR)

(72) Inventors: Seong Min Wang, Yongin-si (KR); Byeong Hoon Cho, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/519,707

(22) Filed: Oct. 21, 2014

(65) Prior Publication Data

US 2015/0364527 A1   Dec. 17, 2015

(30) Foreign Application Priority Data

Jun. 11, 2014   (KR) .................. 10-2014-0071058

(51) Int. Cl.
| | | |
|---|---|---|
| H01L 27/32 | (2006.01) | |
| H01L 27/14 | (2006.01) | |
| H01L 31/02 | (2006.01) | |
| H01L 51/52 | (2006.01) | |
| H01L 27/146 | (2006.01) | |
| H01L 27/148 | (2006.01) | |
| H01L 31/0216 | (2014.01) | |

(52) U.S. Cl.
CPC ........ *H01L 27/3225* (2013.01); *H01L 27/3244* (2013.01); *H01L 27/14623* (2013.01); *H01L 27/14818* (2013.01); *H01L 31/02162* (2013.01); *H01L 31/02164* (2013.01); *H01L 51/5253* (2013.01)

(58) Field of Classification Search
CPC ..................... H01L 51/5253; H01L 27/14623; H01L 27/14818; H01L 31/02162; H01L 31/02164

See application file for complete search history.

(56) References Cited

U.S. PATENT DOCUMENTS

| | | | | |
|---|---|---|---|---|
| 7,791,154 | B2 * | 9/2010 | Sasagawa et al. | 257/432 |
| 8,076,741 | B2 * | 12/2011 | Lai | H01L 27/1225 257/222 |
| 8,154,020 | B2 * | 4/2012 | Cho et al. | 257/53 |
| 9,136,304 | B2 * | 9/2015 | Maeda | H01L 21/76898 |
| 2005/0140869 | A1 * | 6/2005 | Yang et al. | 349/114 |
| 2008/0238311 | A1 * | 10/2008 | Sung et al. | 313/512 |
| 2009/0072167 | A1 | 3/2009 | Kanazawa | |
| 2011/0084337 | A1 * | 4/2011 | Yamazaki | H01L 27/12 257/347 |
| 2012/0104530 | A1 * | 5/2012 | Kaneko et al. | 257/433 |
| 2012/0146028 | A1 * | 6/2012 | Oda et al. | 257/53 |

(Continued)

FOREIGN PATENT DOCUMENTS

| | | |
|---|---|---|
| KR | 10-0916321 B1 | 9/2009 |
| KR | 10-2011-0014478 A | 2/2011 |

(Continued)

*Primary Examiner* — Ida M Soward
(74) *Attorney, Agent, or Firm* — Lee & Morse, P.C.

(57) ABSTRACT

An organic light emitting diode display including a pixel that includes a light-emitting device and a first thin film transistor connected to the light-emitting device; and a sensor that includes a light sensing element, wherein the light sensing element includes a gate electrode; an active layer on the gate electrode; a filter layer on the active layer; and source and drain electrodes on the active layer, the source and drain electrodes being connected to the active layer, the light sensing element and the first thin film transistor are formed on a same substrate, and one of the gate electrode and the active layer of the light sensing element and a gate electrode of the first thin film transistor are aligned on a same layer.

12 Claims, 10 Drawing Sheets

(56) References Cited

U.S. PATENT DOCUMENTS

| | | |
|---|---|---|
| 2012/0147286 A1* | 6/2012 | Oda et al. .................... 349/43 |
| 2012/0212687 A1* | 8/2012 | Uchida et al. ............... 349/43 |
| 2013/0099290 A1 | 4/2013 | Itoh et al. |
| 2013/0270618 A1* | 10/2013 | Fan et al. .................... 257/290 |
| 2014/0248445 A1* | 9/2014 | Tomioka et al. ............ 428/1.27 |
| 2014/0357010 A1* | 12/2014 | Lu et al. ...................... 438/57 |
| 2015/0053935 A1* | 2/2015 | Gupta et al. ................. 257/40 |
| 2015/0194443 A1* | 7/2015 | Chen et al. .................. 257/40 |
| 2015/0380439 A1* | 12/2015 | Chen .................. H01L 27/1218 257/72 |

FOREIGN PATENT DOCUMENTS

| | | |
|---|---|---|
| KR | 10-1036498 B1 | 5/2011 |
| KR | 10-2012-0014502 A | 2/2012 |

* cited by examiner

ORGANIC LIGHT EMITTING DIODE DISPLAY INCLUDING SENSORS

CROSS-REFERENCE TO RELATED APPLICATION

Korean Patent Application No. 10-2014-0071058 filed on Jun. 11, 2014, in the Korean Intellectual Property Office, and entitled: "Organic Light Emitting Diode Display Including Sensors," is incorporated by reference herein in its entirety.

BACKGROUND

1. Field

Embodiments relate to an organic light emitting diode display including sensors.

2. Description of the Related Art

A flat panel display (FPD), such as an organic light emitting diode display (OLED), a liquid crystal display (LCD), and an electrophoretic display (EPD), may include a display panel including a field generating electrode and an electro-optical active layer. As the electro-optical active layer, the panels of the OLED, the LCD, and the EPD may respectively include an organic light emitting layer, a liquid crystal layer, and particles having a charge. The field generating electrode may be connected to a switching device such as a thin film transistor to receive a data signal, and the electro-optical active layer may convert the data signal to an optical signal to display an image.

Among them, the organic light emitting diode display, which has drawn attention in recent years, has a self-emission characteristic and thus does not require a separate light source, differently from the liquid crystal display, so that thickness and weight thereof may be reduced. Further, the organic light emitting diode display shows high quality characteristics such as low power consumption, high luminance, and high response speed.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode display including sensors.

The embodiments may be realized by providing an organic light emitting diode display including a pixel that includes a light-emitting device and a first thin film transistor connected to the light-emitting device; and a sensor that includes a light sensing element, wherein the light sensing element includes a gate electrode; an active layer on the gate electrode; a filter layer on the active layer; and source and drain electrodes on the active layer, the source and drain electrodes being connected to the active layer, the light sensing element and the first thin film transistor are formed on a same substrate, and one of the gate electrode and the active layer of the light sensing element and a gate electrode of the first thin film transistor are aligned on a same layer.

The first thin film transistor may include a polycrystalline semiconductor layer on the substrate; the gate electrode on the polycrystalline semiconductor layer; and source and drain electrodes on the gate electrode, the source and drain electrodes being connected to the polycrystalline semiconductor layer, and the light-emitting device may include a pixel electrode overlying the source and drain electrodes and connected to one of the source and drain electrodes; an organic light emitting layer on the pixel electrode; and a common electrode on the organic light emitting layer.

The source and drain electrodes of the light sensing element may be aligned on a same layer as the pixel electrode of the light-emitting device, and may be formed of a same material as the pixel electrode.

The filter layer and the source and drain electrodes of the light sensing element may be aligned on a same layer.

The gate electrode of the light sensing element may be aligned on a same layer as the gate electrode of the first thin film transistor, and may be formed of a same material as the gate electrode of the first thin film transistor.

The active layer of the light sensing element may be aligned on a same layer as the source and drain electrodes of the first thin film transistor.

The gate electrode of the light sensing element may be aligned on a same layer as the polycrystalline semiconductor layer, and may be formed of a doped polycrystalline semiconductor.

The active layer of the light sensing element may be aligned on a same layer as the gate electrode of the first thin film transistor.

The light-emitting device may further include an infrared emitting layer between the pixel electrode and the organic light emitting layer.

The sensor may further include a second thin film transistor that includes source and drain electrodes, and one of the source and drain electrodes of the second thin film transistor may be connected to one of the source and drain electrodes of the light sensing element.

The sensor may further include a capacitor that includes a first electrode and a second electrode, the first electrode of the capacitor may be aligned on a same layer as the semiconductor layer of the first thin film transistor and is formed of a doped semiconductor, and the second electrode of the capacitor may be aligned on a same layer as the gate electrode of the first thin film transistor and is formed of the same material as the gate electrode of the first thin film transistor.

The filter layer may include a band-pass filter containing one of poly(methyl methacrylate), polycarbonate, and polyimide.

The embodiments may be realized by providing an organic light emitting diode display including a pixel that includes a light-emitting device and a first thin film transistor connected to the light-emitting device; and a sensor that includes a light sensing element, wherein the light sensing element includes an active layer; a gate electrode on the active layer; a filter layer on the gate electrode; and source and drain electrodes on the gate electrode, the source and drain electrodes being connected to the active layer, the light sensing element and the first thin film transistor are formed on a same substrate, and the active layer of the light sensing element underlies an insulating layer, the insulating layer underlying a semiconductor layer of the first thin film transistor.

The first thin film transistor may include a polycrystalline semiconductor layer on the substrate; the gate electrode on the polycrystalline semiconductor layer; and source and drain electrodes on the gate electrode, the source and drain electrodes being connected to the polycrystalline semiconductor layer, and the light-emitting device may include a pixel electrode on the source and drain electrodes, the pixel electrode being connected to one of the source and drain electrodes; an organic light emitting layer on the pixel electrode; and a common electrode on the organic light emitting layer.

The source and drain electrodes of the light sensing element may be aligned on a same layer as the pixel electrode of the light-emitting device, and may be formed of a same material as the pixel electrode.

The gate electrode of the light sensing element may be aligned on a same layer as the polycrystalline semiconductor layer, and may be formed of a doped polycrystalline semiconductor.

The filter layer may include a band-pass filter containing one of poly(methyl methacrylate), polycarbonate, and polyimide.

The light-emitting device may further include an infrared emitting layer between the pixel electrode and the organic light emitting layer.

The sensor may further include a second thin film transistor that includes source and drain electrodes, one of the source and drain electrodes of the second thin film transistor may be connected to one of the source and drain electrodes of the light sensing element.

The sensor may further include a capacitor that includes a first electrode and a second electrode, the first electrode of the capacitor may be aligned on a same layer as the semiconductor layer of the first thin film transistor and is formed of a doped semiconductor, and the second electrode of the capacitor may be aligned on a same layer as the gate electrode of the first thin film transistor and is formed of the same material as the gate electrode of the first thin film transistor.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
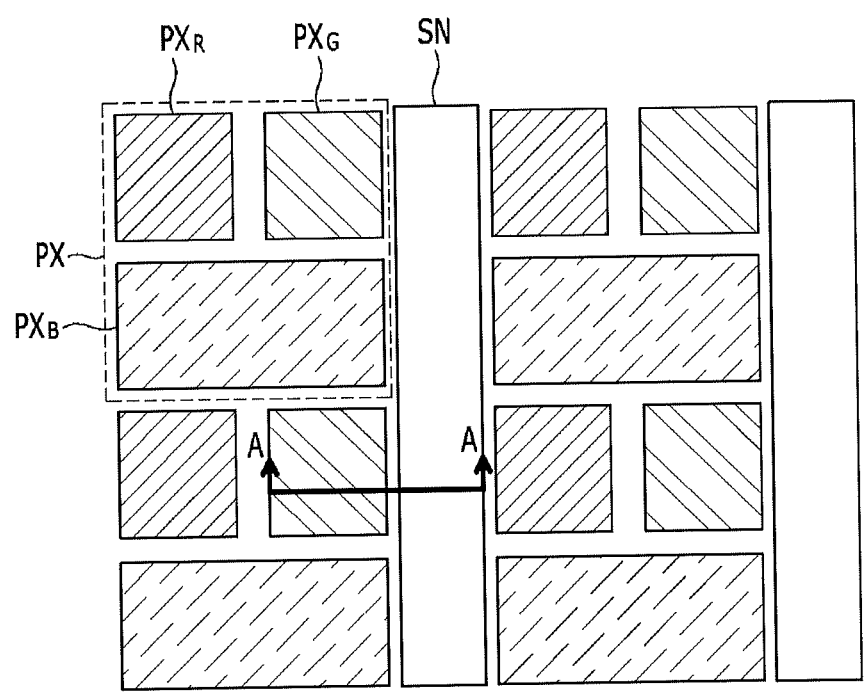
FIG. 1 illustrates a layout view of a pixel and a sensor in an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 illustrates a layout view of a pixel and a sensor in the organic light emitting diode display according to an embodiment.

As shown in FIG. 1, the organic light emitting diode display of the present exemplary embodiment may include a plurality of unit pixels PX and a plurality of sensors SN.

Each of the unit pixels may include a PX red pixel $PX_R$, a green pixel $PX_G$, and a blue pixel $PX_B$. The unit pixels PX may be arranged in a matrix shape in row and column directions.

The red pixel $PX_R$ and the green pixel $PX_G$ may be positioned to be horizontally adjacent to each other, and the blue pixel $PX_B$ may be located below the red pixel $PX_R$ and the green pixel $PX_G$. Widths of the red pixel $PX_R$ and the green pixel $PX_G$ may be narrower than that of the blue pixel $PX_B$, and a width of the blue pixel $PX_B$ may correspond to a sum of the widths of the red pixel $PX_R$ and the green pixel $PX_G$ and the distance therebetween. Arrangement and size of pixels in the unit pixel PX shown in FIG. 1 are merely examples, and may be varied depending on the exemplary embodiments.

One sensor SN may be disposed between adjacent unit pixels in the organic light emitting diode display according to an exemplary embodiment. The sensor SN may include a light sensing element, a switching device, and a capacitor. The sensor SN is illustrated to be disposed at each row of the unit pixels PX in the exemplary embodiment shown in FIG. 1, but may be disposed at every plural rows of the unit pixels PX according to another exemplary embodiment. Further, the light sensing element of the sensor SN may be disposed at a sensor region between certain adjacent unit pixels, and the switching device and the capacitor of the sensor SN may be disposed at a sensor region between other certain adjacent unit pixels.

Figure 2:
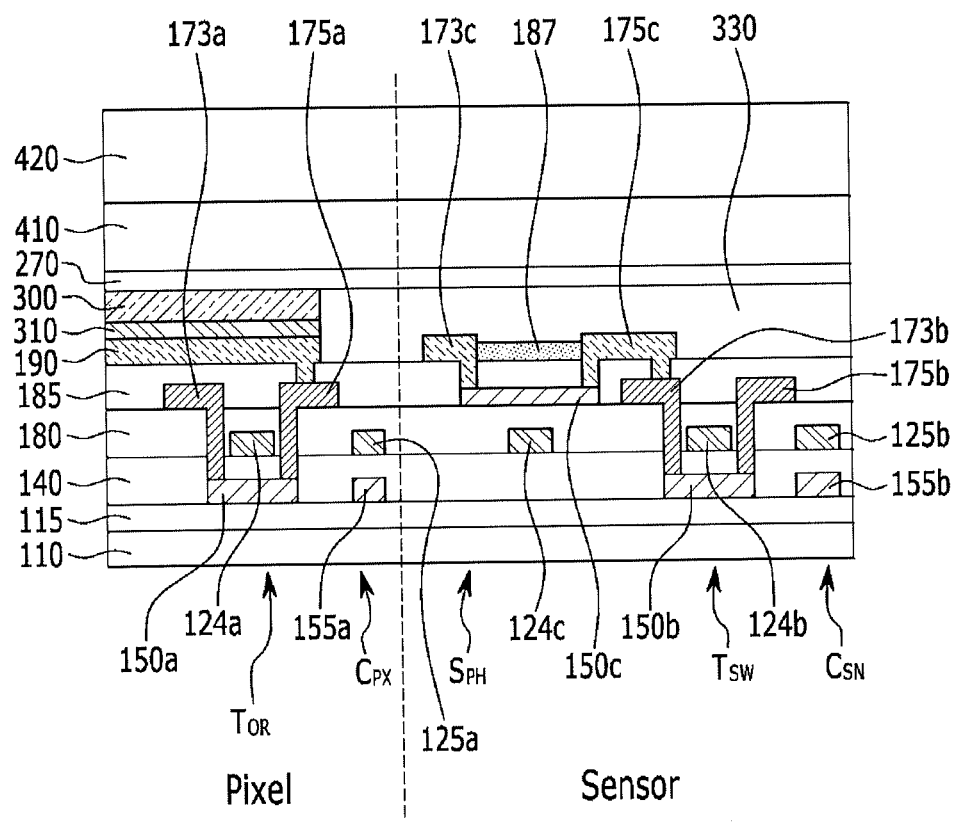
FIG. 2 illustrates a cross-sectional view of the organic light emitting diode display taken along the line A-A of FIG. 1 according to a first embodiment.

FIG. 2 illustrates a cross-sectional view of the organic light emitting diode display taken along the line A-A of FIG. 1 according to a first embodiment.

FIG. 2 illustrates a cross-sectional structure of one pixel (i.e., the green pixel $PX_G$) and the sensor SN. First, the structure of the pixel will be described.

One pixel may include an organic light emitting layer 300, a pixel electrode 190 positioned below (e.g., underlying) the organic light emitting layer 300, and a common electrode 270 positioned above (e.g., overlying) the organic light emitting layer 300. For example, the organic light emitting layer 300 may be between the pixel electrode 190 and the common electrode 270. In an implementation, the pixel electrode 190 may be separately formed in every pixel, and the common electrode 270 may be formed as a single unit in all the pixels. The organic light emitting layer 300 may include an electro-optical active layer in which electrons and holes are injected and recombined to generate light, and an image may be displayed by using combinations of light generated per pixel.

An infrared emitting layer 310 may be disposed between the organic light emitting layer 300 and the pixel electrode 190. The infrared emitting layer 310 may emit infrared lays toward a front side (e.g., toward an encapsulation layer 420 in FIG. 2) of a display panel in order to sense the contact or hover of an object such as a finger or a touch pen. The infrared rays generated by the infrared emitting layer 310 may be reflected by an object and back into the light sensing element $S_{PH}$ of the sensor SN. In an implementation, the infrared emitting layer 310 may be disposed be disposed between the organic light emitting layer 300 and the common electrode 270, or may be disposed between the pixel electrode 190 and the common electrode 270 in such a way so as to not be overlapped with the organic light emitting layer 300. Various other designs are also possible.

The pixel electrode 190 may be connected to an output terminal (drain electrode 175a) of a thin film transistor (such as a driving transistor $T_{DR}$) to receive an output current of the driving transistor $T_{DR}$. The thin film transistor (e.g., driving transistor $T_{DR}$) may include a semiconductor layer 150a, a gate electrode 124a, a source electrode 173a, and the drain electrode 175a.

One pixel may include a pixel capacitor $C_{PX}$ that is connected to the source electrode 173a and the gate electrode 124a of the driving transistor $T_{DR}$. The pixel capacitor $C_{PX}$ may include a lower capacitor electrode 155a (formed of a doped polycrystalline semiconductor), an upper capacitor electrode 125a (formed at or on, e.g., aligned with, a same layer as the gate electrode 124a by using the same material as the gate electrode 124a), and a gate insulating layer GIL (serving as an insulating layer) disposed therebetween. For example, the upper capacitor electrode 125a may be substantially coplanar with the gate electrode 124a. In an implementation, the organic light emitting diode display may include an interlayer insulating layer 180, and the upper capacitor electrode 125a and a capacitor electrode (not shown) that are overlapped with each other with the interlayer insulating layer 180 being disposed therebetween, or may further include such a capacitor electrode. In this case, any one capacitor electrode may be formed at a different layer.

In FIG. 2, the pixel is illustrated to include one thin film transistor, but may include at least two thin film transistors. When including the minimum number of thin film transistors, the pixel may include the driving transistor $T_{DR}$ and a switching transistor (not shown). In an implementation, the pixel may further include a transistor serving to compensate the driving transistor $T_{DR}$, a transistor serving to adjust a light emission time of the organic light emitting layer 300, or the like.

The layer structure of a pixel area including such constituent elements will be sequentially described.

A lower substrate 110 may be a flexible substrate such as a polymer film. For example, the lower substrate 110 may be made of a plastic such as a thermoplastic semicrystalline polymer such as polyethylene terephthalate (PET), polyethylene naphthalate (PEN), or polyethylene ether ketone (PEEK), a thermoplastic amorphous polymer such as polycarbonate (PC) or polyethylene sulfonate (PES), a polyimide (PI) having relatively high thermal resistance, or a polyarylate (PAR). In an implementation, the lower substrate 110 may be a rigid substrate made of glass.

A buffer layer 115 may be formed on the lower substrate 110 to help reduce and/or prevent the penetration of moisture, oxygen, or the like. The buffer layer 115 may be formed by depositing an inorganic material as a monolayer or a multilayer, or as an organic/inorganic hybrid multilayer. Although not shown, an overcoat layer may be formed on the buffer layer 115 to help protect the layers. In an implementation, the buffer layer 115 may be omitted according to a kind of the substrate or a process condition.

A polycrystalline semiconductor layer 150a and a lower capacitor electrode 155a (formed of a doped polycrystalline semiconductor) may be formed on the buffer layer 115. The polycrystalline semiconductor may be formed, e.g., by depositing amorphous silicon by a plasma CVD method, performing dehydrogenation treatment where hydrogen included in the amorphous silicon is removed, and/or forming a polysilicon state through laser crystallization such as excimer laser annealing. As a polycrystallization method, as well as the laser crystallization, a thermal crystallization method such as solid phase crystallization (SPC), super grain silicon (SGS) crystallization, metal induced crystallization (MIC), or metal induced lateral crystallization (MILC) may be used.

The polycrystalline semiconductor layer 150a may include a source region and a drain region in which an impurity is doped on both edges thereof. The doped polycrystalline semiconductor that is used to form the lower capacitor electrode 155a may have a conductor characteristic rather than a semiconductor characteristic by high concentration doping. In a crystallization process for forming a polycrystalline semiconductor, the buffer layer 115 may also serve to block penetration of impurities from the lower substrate 110 into the semiconductor.

The polycrystalline semiconductor layer 150a, the lower capacitor electrode 155a, and the exposed buffer layer 115 may be covered by the gate insulating layer 140. The gate insulating layer 140 may be formed of an inorganic insulating material, e.g., SiOx, SiNx, SiONx, $Al_2O_3$, TiO, $Ta_2O_5$, $HfO_2$, $ZrO_2$, BST, or PZT. In an implementation, the gate insulating layer 140 may be formed material in a monolayer or in a multilayer, and may include a layer formed of, e.g., SiNx, SiOx, and/or SiONx.

The gate electrode 124a and the upper capacitor electrode 125a may be formed on the gate insulating layer 140. The gate electrode 124a may be overlapped with or may overlie a part of the polycrystalline semiconductor layer 150a, and the upper capacitor electrode 125a may be overlapped with or may overlie the lower capacitor electrode 155a. The gate electrode 124a and the upper capacitor electrode 125a may be formed of a conductive metal, e.g., Al, Cu, Mo, W, Cr, or alloys thereof, and/or various conductive materials including a transparent conductive material, e.g., indium tin oxide (ITO), indium zinc oxide (IZO), or zinc oxide (ZnO), or a conductive polymer may be used as well as the metal material. The gate electrode 124a may have a multi-layered structure, e.g., a dual-layer structure including a lower layer formed of a transparent conductive material and an upper layer formed of a metal.

An interlayer insulating layer 180 may cover or may be formed on the gate electrode 124a, the upper capacitor electrode 125a, and the exposed gate insulating layer 140. The interlayer insulating layer 180 may be formed of an organic material and/or an inorganic material.

The interlayer insulating layer 180 and the gate insulating layer 140 may include contact holes through which the source region and the drain region of the polycrystalline semiconductor layer 150a are exposed. A source electrode 173a and a drain electrode 175a may be formed on the interlayer insulating layer 180 and the contact holes. The source electrode 173a may contact the source region of the polycrystalline semiconductor layer 150a, and the drain electrode 175a may contact the drain region of the polycrystalline semiconductor layer 150a.

A passivation layer 185 may be formed on the source electrode 173a, the drain electrode 175a, and the interlayer insulating layer 180. The passivation layer 185 may be formed of an organic material or an inorganic material. A contact hole for exposing the drain electrode 175a may be formed in the passivation layer 185. The pixel electrode 190 may be formed on the passivation layer 185 and in the contact hole. The pixel electrode 190 may be connected to the drain electrode 175a through the contact hole.

A pixel defining layer (PDL) 330 may be formed around the pixel electrode 190, and may include a plurality of openings corresponding to the pixels. The pixel defining layer 330 may be made of a resin such as a polyacrylate and a polyimide. The pixel electrode 190 may be exposed at a portion at which no pixel defining layer 330 is formed, and the infrared emitting layer 310 may be disposed on the pixel electrode 190. The infrared emitting layer 310 may generate infrared rays that are reflected by an object and are introduced or reflected back into the light sensing element $S_{PH}$ of the sensor SN.

The organic light emitting layer 300 may be disposed on the infrared emitting layer 310. The organic light emitting layer 300 may include an emission layer EML, and may be formed as a multilayer including at least one of a hole injection layer (HIL), a hole transport layer (HTL), an electron transport layer (ETL), and an electron injection layer (EIL), to emit different color light according to kinds of the organic material.

The common electrode 270 may be formed on the organic light emitting layer 300 and the pixel defining layer 330.

The pixel electrode 190, the organic light emitting layer 300, and the common electrode 270 may constitute a light emitting device for displaying an image in the organic light emitting diode display. In this case, the pixel electrode 190 and the common electrode 270 may respectively serve as an anode and a cathode of the light emitting device. At least one of the pixel electrode 190 and the common electrode 270 may be formed of a transparent conductive material.

For example, light emitted from the organic light emitting layer 300 may be provided to user eyes through the transparent conductive material. For example, the common electrode 270 may be formed of a transparent conductive material such as indium tin oxide (ITO), indium zinc oxide (IZO), zinc oxide (ZnO), indium oxide ($In_2O_3$), nanowire, carbon nanotubes (CNT), or grapheme, and the pixel electrode 190 may be formed of a metal such as lithium (Li), calcium (Ca), lithium fluoride/calcium (LiF/Ca), lithium fluoride/aluminum (LiF/Al), aluminum (Al), silver (Ag), magnesium (Mg), or gold (Au), or indium tin oxide/silver/indium tin oxide (ITO/Ag/ITO).

A capping layer 410 may be formed on the common electrode 270, and an encapsulation layer 420 may be formed on the capping layer 410. The capping layer 410 may be formed of an inorganic material or an organic material. In an implementation, the capping layer 410 may be omitted. The encapsulation layer 420 may encapsulate the light emitting device to help prevent penetration of moisture and/or oxygen from the outside. The encapsulation layer 420 may include a plurality of encapsulating thin films (ETFs). For example, the encapsulation layer 420 may include at least one inorganic film (not shown) and at least one organic film (not shown), or may be formed by alternately stacking the inorganic film and the organic film. The inorganic layer may be the single layer or the multilayer including a metal oxide or a metal nitride. For example, the inorganic layer may include one of a silicon nitride (SiNx), an aluminum oxide (AlOx), a silicon oxide (SiOx), and a titanium oxide (TiOx). A highest layer that is exposed to the outside in the encapsulation layer 420 (e.g., an outermost layer of the encapsulation layer 420) may be formed of the inorganic layer in order to help reduce and/or prevent moisture from permeating into the light emitting device. The organic layer may be formed of the polymer, and may be a monolayer or a multilayer formed of, e.g., polyethylene terephthalate (PET), polyimide (PI), polycarbonate (PC), epoxy, polyethylene (PE), or polyacrylate (PA).

A polarization layer (not shown) for reducing reflection of external light may be attached on the encapsulation layer 420. A window layer (not shown) may be attached on the polarization layer.

Next, the structure of the sensor SN will be described. Similar to the pixels, the sensor SN may be formed on the lower substrate 110.

The sensor SN may include the light sensing element $S_{PH}$ for sensing infrared rays. The light sensing element $S_{PH}$ may include a gate electrode 124c, an active layer 150c, a source electrode 173c and a drain electrode 175c, and a filter layer 187. In an implementation, the light sensing element $S_{PH}$ may be configured to sense light having wavelengths other than those of the infrared rays.

The buffer layer 115 may be formed on the lower substrate 110, and the gate insulating layer 140 may be formed on the buffer layer 115. The gate electrode 124c of the light sensing element $S_{PH}$ may be formed on the gate insulating layer 140. The gate electrode 124c of the light sensing element $S_{PH}$ may be formed at or on a same layer as the gate electrode 124a of a thin film transistor of one pixel by using the same material as the gate electrode 124a. For example, the gate electrode 124c of the light sensing member $S_{PH}$ may be substantially coplanar with the gate electrode 124a of a thin film transistor of one pixel.

The gate electrode 124c may be covered by the interlayer insulating layer 180. The active layer 150c may be formed on the interlayer insulating layer 180 to be overlapped with or overlie the gate electrode 124c. The light sensing element may have a bottom-gate structure that is from the thin film transistor of one pixel having a top-gate structure in which a gate electrode is disposed above a semiconductor layer. For example, the gate electrode 124c may be disposed below or may underlie the active layer 150c. The active layer 150c may be formed of a silicon compound such as silicon germanium (SiGe) or an oxide semiconductor such as zinc oxynitride (ZnON). In an implementation, the active layer 150c may be formed of amorphous silicon, amorphous germanium, amorphous silicon germanium, microcrystalline silicon, or the like. In an implementation, the active layer 150c may include a material that enables the active layer 150c to serve as a photo sensor.

The passivation layer 185 may be formed on the active layer 150c. Contact holes may be formed in the passivation layer 185 to expose opposite edges of the active layer 150c. The filter layer 187 may be formed on the passivation layer 185 to be overlapped with the active layer 150c. In an implementation, the source electrode 173c and the drain electrode 175c may be formed on the passivation layer 185, and may respectively contact the opposite edges of the active layer 150c through the contact holes.

For example, the filter layer 187 may be an infrared band-pass filter (IR BPF) that permits infrared rays to exclusively pass therethrough. When the light sensing element is an infrared sensor, the infrared sensor could react with not only infrared rays but also visible rays, and thus the visible rays introduced into the infrared sensor could cause malfunctioning of the sensor. Accordingly, it is possible to optimize sensitivity of the active layer 150c by forming the band-pass filter that exclusively permits infrared rays (having a wavelength region of about 800 nm or more) to be introduced into the active layer 150c, and blocks introduction of visual rays (having wavelengths ranging from about 300 nm to about 800 nm) on or from the active layer 150c.

The filter layer 187 may include an organic material, e.g., poly(methylmethacrylate) (PMMA), polycarbonate (PC), or polyimide (PI). The filter layer 187 may include an organic material containing a block pigment, amorphous silicon, amorphous germanium, an amorphous germanium compound, amorphous silicon germanium, and microcrystalline silicon. In an implementation, the filter layer 187 may include a suitable material that has characteristics of the infrared band-pass filter.

The source and drain electrodes 173c and 175c may be disposed at or on, e.g., aligned with, a same layer as the pixel electrode 190 of the light-emitting device by using the same material of the pixel electrode 190. For example, the source and drain electrodes 173c and 175c may be substantially coplanar with the pixel electrode 190 (e.g., horizontally planar portions of the source and drain electrodes 173c and 175c may be substantially coplanar with horizontally planar portions the pixel electrode 190, as shown in FIG. 2).

The pixel defining layer 330 may cover or may be on the source and drain electrodes 173c and 175c and the filter layer 187, and the common electrode 270 of the light-emitting device may be formed on the pixel defining layer 330 to extend therealong. The capping layer 410 may be formed on the common electrode 270, and the encapsulation layer 420 may be formed on the capping layer 410. In an implementation, similar to the pixel area, a polarization layer and a window layer may be attached thereon.

The sensor SN may further include the switching transistor $T_{SW}$ that is connected to the light sensing element $S_{PH}$ to transfer a signal from the light sensing element $S_{PH}$. The switching transistor $T_{SW}$ may include a polycrystalline semiconductor layer 150b, a gate electrode 124b, and the source and drain electrodes 173b and 175b. The switching transistor $T_{SW}$ may be adjacent to the light sensing element $S_{PH}$, or may be disposed separately therefrom to be connected thereto by using a wire.

The switching transistor $T_{SW}$ may have the same structure as the driving transistor $T_{DR}$ of one pixel. For example, the polycrystalline semiconductor layer 150 may be formed on the buffer layer 115 that is formed on the lower substrate 110. The gate electrode 124b may be formed on the gate insulating layer 140 that is formed on the polycrystalline semiconductor layer 150b. The source and drain electrodes 173b and 175b may be formed on the interlayer insulating layer 180 and may respectively contact the source region and the drain region of the polycrystalline semiconductor layer 150b through the contact holes formed in the interlayer insulating layer 180 and the gate insulating layer 140. The switching transistor $T_{SW}$ having this structure may be simultaneously formed when the driving transistor $T_{DR}$ of one pixel is formed.

In the meantime, the drain electrode 175c of the light sensing element $S_{PH}$ may be connected to the source electrode 173b of the switching transistor $T_{SW}$ through the contact hole formed in the passivation layer 185. In an implementation, the drain electrode 175c of the light sensing element $S_{PH}$ may be electrically connected to the source electrode 173b of the switching transistor $T_{SW}$ by using an additional connection wire.

The sensor SN may further include a capacitor $C_{SN}$. The capacitor $C_{SN}$ of the sensor SN may be formed by the lower capacitor electrode 155a as the doped polycrystalline semiconductor, the upper capacitor electrode 125a (formed at the same layer as the gate electrode 124c by using the same material as the gate electrode 124c), and the gate insulating layer 140 interposed therebetween. One electrode of the capacitor $C_{SN}$ may be electrically connected to the source electrode 173c of the light sensing element, and the other electrode thereof may be electrically connected to the drain electrode 175c of the light sensing element and the source electrode 173b of the switching device. The capacitor $C_{SN}$ of the sensor SN may be simultaneously formed when the capacitor $C_{PX}$ of one pixel.

Next, a manufacturing method of main parts of the organic light emitting diode display including sensors will be described with reference to FIG. 2 and FIG. 3.

Figure 3:
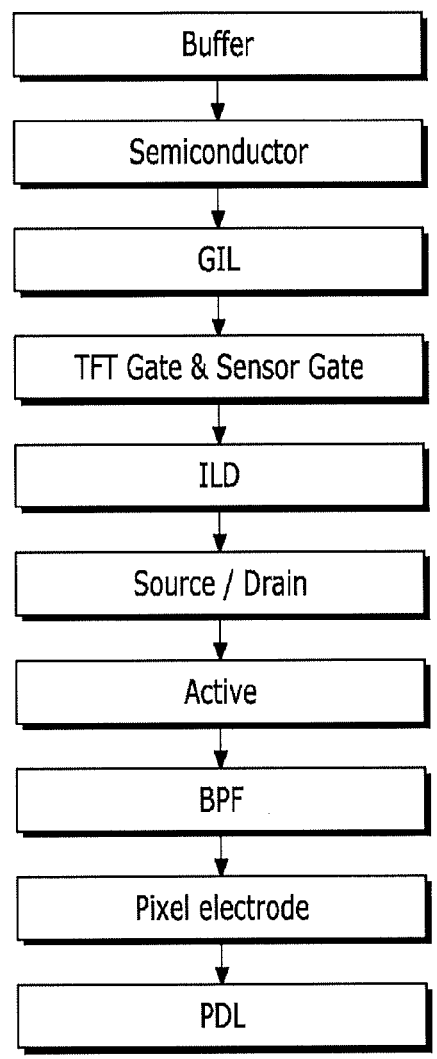
FIG. 3 illustrates a schematic flowchart of a manufacturing method according to the first embodiment.

FIG. 3 illustrates a schematic flowchart of a manufacturing method according to the first embodiment.

First, the buffer layer 115 may be formed on the lower substrate 110. Then, the polycrystalline semiconductor layers 150a and 150b of the driving transistor $T_{DR}$ and the switching transistor $T_{SW}$, and the lower capacitor electrodes 155a and 155b of the capacitors $C_{PX}$ and $C_{SN}$ may be formed by forming an amorphous silicon layer and then performing a dehydrogenation process, a crystallization process, and a photolithography process.

After the gate insulating layer 140 is formed, the gate electrodes 124a and 124b of the driving transistor $T_{DR}$ and the switching transistor $T_{SW}$, the gate electrode 124c of the light sensing element $S_{PH}$, and the upper capacitor electrode 125a and 125b of the capacitors $C_{PX}$ and $C_{SN}$ may be formed on the gate insulating layer 140. Then, the source region and the drain region of the polycrystalline semiconductor layers 150a and 150b of the driving transistor $T_{DR}$ and the switching transistor $T_{SW}$, and the lower capacitor electrodes 155a and 155b of the capacitors $C_{PX}$ and $C_{SN}$ may be doped with impurities. In an implementation, the doping of the lower capacitor electrodes 155a and 155b may be performed before the upper capacitor electrodes 125a and 125b are formed.

After the interlayer insulating layer 180 is formed and contact holes are formed in the interlayer insulating layer 180, the source electrodes 173a and 173b and the drain electrodes 175a and 175b (which respectively contact the source region and the drain region of the polycrystalline semiconductor layers 150a and 150b of the driving transistor $T_{DR}$ and the switching transistor $T_{SW}$) may be formed. Next, the active layer 150c of the light sensing element $S_{PH}$ may be formed.

Then, the passivation layer 185 may be formed, and the filter layer 187 may be formed. Next, the drain electrode 175a of the driving transistor $T_{DR}$, opposite edges of the active layer 150c of the light sensing element, and the contact hole for exposing the source electrode 173b of the switching transistor $T_{SW}$ may be formed, and the pixel electrode 190 of the driving transistor $T_{DR}$ and the source and drain electrodes 173c and 175c of the light sensing element may be formed on the passivation layer 185. In this case, the drain electrode 175c of the light sensing element may be connected to the source electrode 173b of the switching transistor $T_{SW}$.

In an implementation, the filter layer 187 and the passivation layer 185 may be formed of the same group of organic material (e.g., polyimide), and the patterning of the filter layer 187 and formation of the contact hole in the passivation layer 185 may be performed by using one mask.

The pixel defining layer 330 (for exposing the pixel electrode 190) may be formed, and the infrared emitting layer 310 and the organic light emitting layer 300 may be formed on the pixel electrode 190. Next, the common electrode 270 (by which the organic light emitting layer 300 and the pixel defining layer 330 are covered) may be formed.

Next, the capping layer 410, the encapsulation layer 420, the polarization layer, or the like may be formed.

According to the present embodiment, the active layer 150c of the light sensing element $S_{PH}$ may be formed after the polycrystalline semiconductor layers 150a and 150b of the thin film transistors are formed, and thus the active layer 150c may hardly be affected by the dehydrogenation process and the crystallization process for forming the polycrystalline semiconductor. As a result, it is possible to prevent degradation of the active layer of the light sensing element due to the high temperature processes.

A second embodiment will be described with reference to FIG. 4 and FIG. 5.

Figure 4:
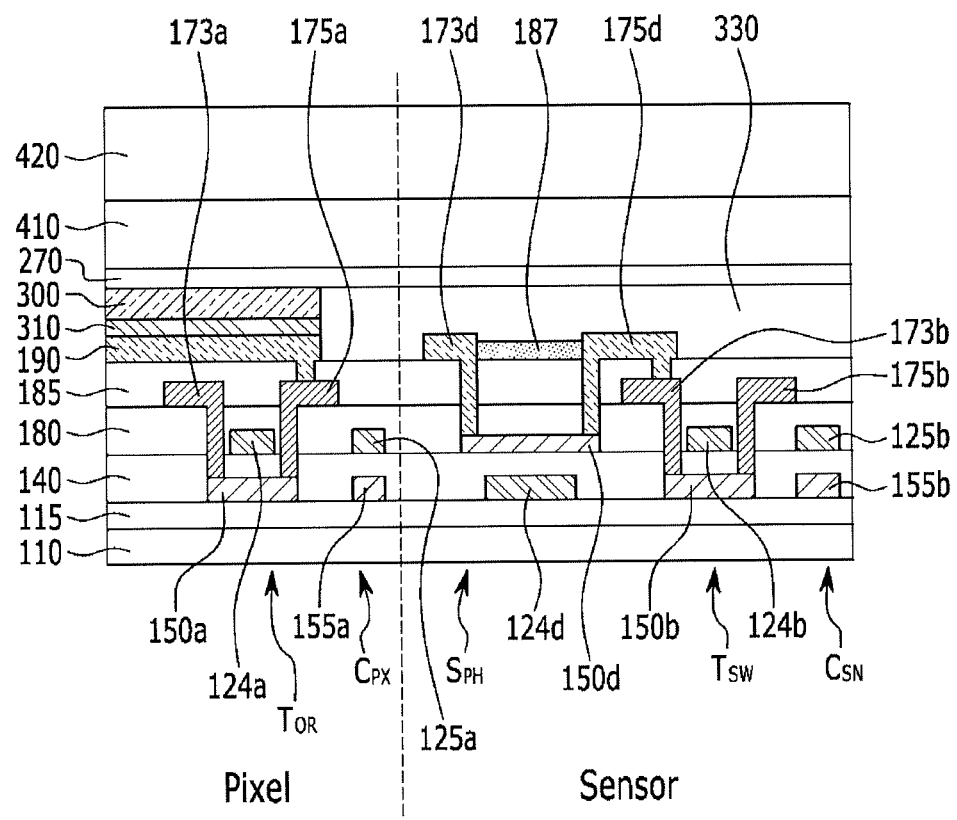
FIG. 4 illustrates a cross-sectional view of the organic light emitting diode display taken along the line A-A of FIG. 1 according to a second embodiment.
Figure 5:
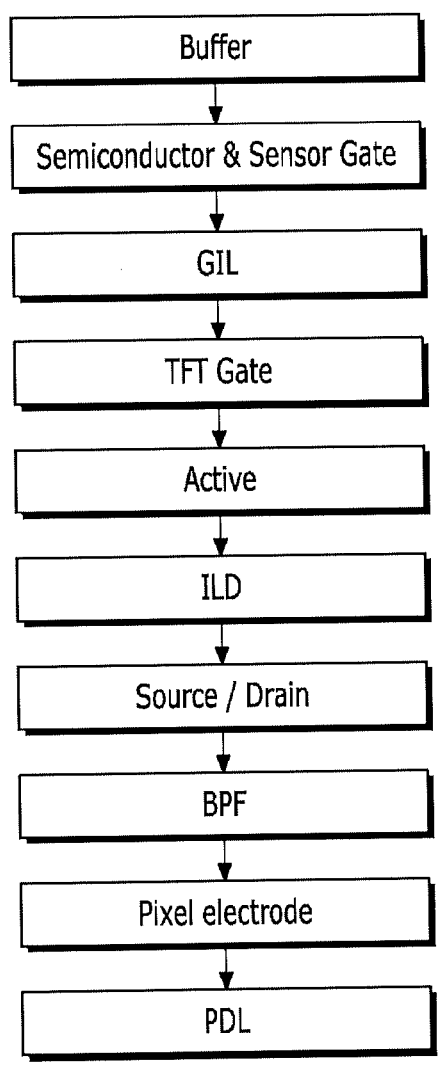
FIG. 5 illustrates a schematic flowchart of a manufacturing method according to the second embodiment.

FIG. 4 illustrates a cross-sectional view of the organic light emitting diode display taken along the line A-A of FIG. 1 according to the second embodiment, and FIG. 5 illustrates a schematic flowchart of a manufacturing method according to the second embodiment.

A structure of one pixel according to the second embodiment may be the same as that of the first embodiment. The switching transistor $T_{SW}$ of the sensor SN according to the second embodiment may also be the same as that of the first embodiment. However, the light sensing element $S_{PH}$ according to the second embodiment is different from that of the first embodiment in the positions of the gate electrode and the active layer and the formation material of the gate electrode. Hereinafter, the second embodiment will be described based on the difference from the first embodiment, and elements of the second embodiment that are not mentioned herein may be the same as those of the first embodiment.

For the light sensing element $S_{PH}$, a gate electrode 124d may be formed on the buffer layer that is formed on the lower substrate 110. The gate electrode 124d may be disposed at or on a same layer as the lower capacitor electrodes 155a and 155b and the polycrystalline semiconductor layers 150a and 150b of the driving and switching transistors $T_{DR}$ and $T_{SW}$, and may be formed of a doped polycrystalline semiconductor to have the conductor characteristic like the lower capacitor electrodes 155a and 155b. For example, the gate electrode 124d may be substantially coplanar with the lower capacitor electrodes 155a and 155b and the polycrystalline semiconductor layers 150a and 150b of the driving and switching transistors $T_{DR}$ and $T_{SW}$.

The gate insulating layer 140 may be formed on the gate electrode 124d, and an active layer 150d that is overlapped with or that overlies the gate electrode 124d may be formed on the gate insulating layer 140. As a result, the active layer 150d may be disposed at or on a same layer as the upper capacitor electrode 125a and 125b and the gate electrode 124a and 124b of the driving and switching transistors $T_{DR}$ and $T_{SW}$. For example, the active layer 150d may be substantially coplanar with the upper capacitor electrode 125a and 125b and the gate electrode 124a and 124b of the driving and switching transistors $T_{DR}$ and $T_{SW}$. As in the first embodiment, the active layer 150d may be formed of silicon, a silicon compound, an oxide semiconductor, or the like.

The interlayer insulating layer 180 may be formed on the active layer 150d, and the passivation layer 185 may be formed on the interlayer insulating layer 180. Contact holes (for exposing opposite edges of the active layer 150d) may be formed in the passivation layer 185 and the interlayer insulating layer 180. The filter layer 187 may be formed on the passivation layer 185 to be overlapped with or overlie the active layer 150d. The filter layer 187 may be an infrared band-pass filter having characteristics that block introduction of visual rays and permit infrared rays to exclusively pass therethrough.

In an implementation, the source electrode 173d and the drain electrode 175d may be formed on the passivation layer 185, and may respectively contact the opposite edges of the active layer 150d through the contact holes. The drain electrode 175d may be connected to the source electrode 173b of the switching transistor $T_{SW}$ through the contact holes formed in the passivation layer 185. The source electrode 173d and the drain electrode 175d may be disposed at or on a same layer as the pixel electrode 190 by using the same material as the pixel electrode 190. For example, the source electrode 173d and the drain electrode 175d may be substantially coplanar with the pixel electrode 190.

The organic light emitting diode display according to the second embodiment may be different from that of the first embodiment in the active layer 150d and the gate electrode 124d of the light sensing element $S_{PH}$, and thus the second embodiment may also be slightly different from the first embodiment in the manufacturing method. For example, the gate electrode 124d may be formed when the polycrystalline semiconductor layers 150a and 150b and the lower capacitor electrodes 155a and 155b are formed, after the buffer layer 115 is formed on the lower substrate 110. The active layer 150d may be formed after the gate electrodes 124a and 124b and the upper capacitor electrodes 125a and 125b are formed on the gate insulating layer 140, and before the interlayer insulating layer 180 is formed. In an implementation, the active layer 150d may be formed after the gate insulating layer 140 is formed, and before the gate electrodes 124a and 124b and the upper capacitor electrodes 125a and 125b are formed. The interlayer insulating layer 180 and the passivation layer 185 may be formed on the active layer 150d, and it may be required to form contact holes that extend through both the interlayer insulating layer 180 and the passivation layer 185 in order to bring the source and drain electrodes 173d and 175d into contact with the active layer 150d.

Similar to the first embodiment, the active layer 150d of the light sensing element $S_{PH}$ may be formed after the polycrystalline semiconductor layers 150a and 150b of the thin film transistor are formed. Accordingly, the active layer 150c may hardly be affected by the dehydrogenation process and the crystallization process for forming the polycrystalline semiconductor.

A third embodiment will be described with reference to FIG. 6 and FIG. 7.

Figure 6:
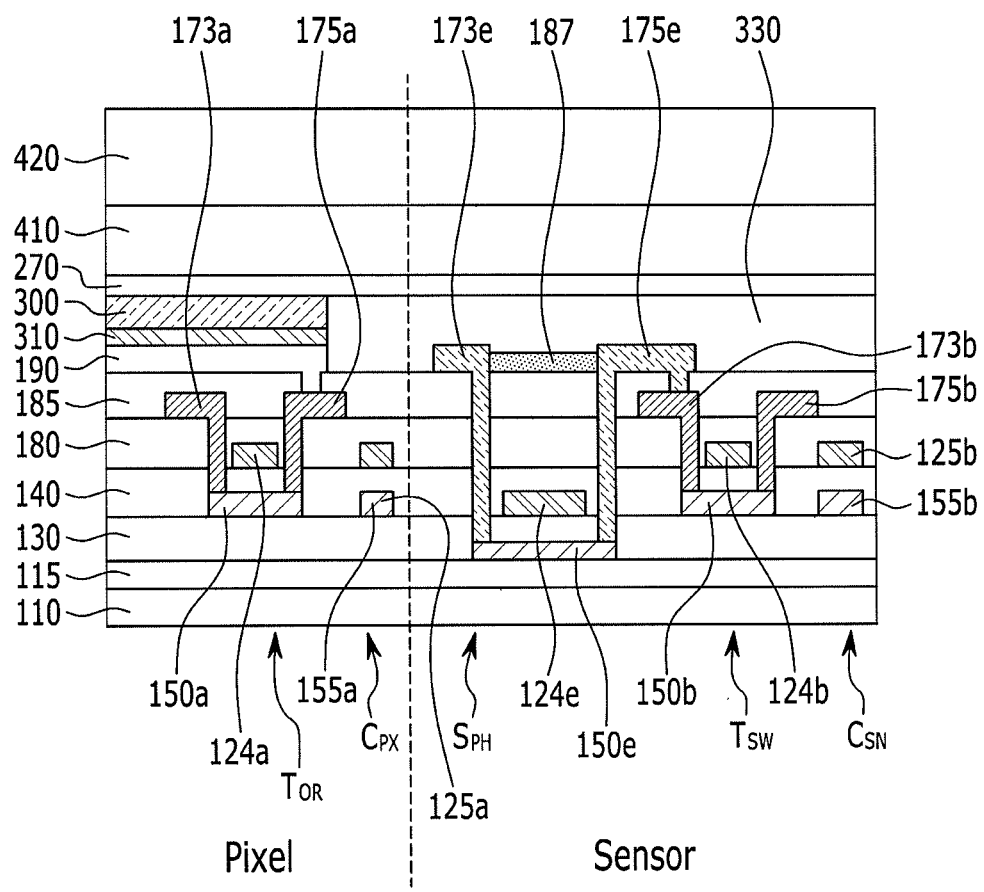
FIG. 6 illustrates a cross-sectional view of the organic light emitting diode display taken along the line A-A of FIG. 1 according to a third embodiment.
Figure 7:
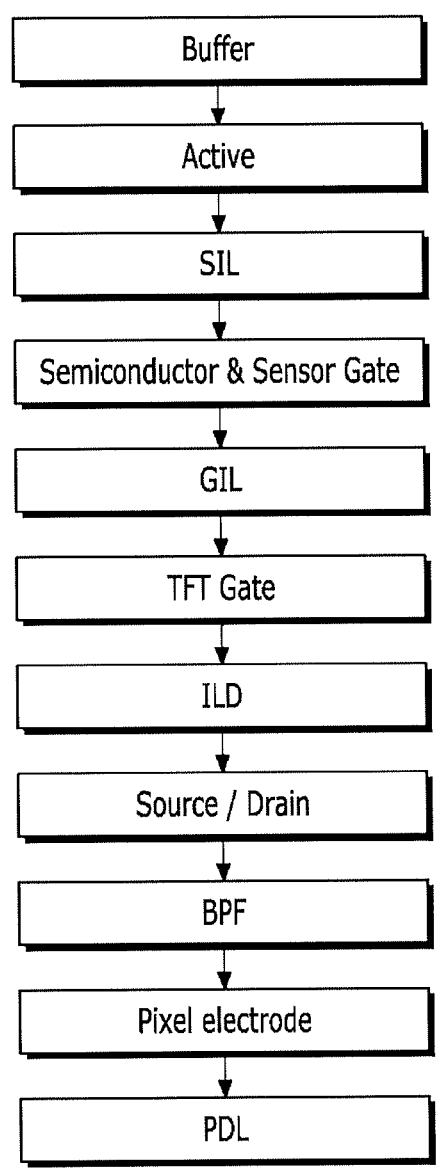
FIG. 7 illustrates a schematic flowchart of a manufacturing method according to the third embodiment.

FIG. 6 illustrates a cross-sectional view of the organic light emitting diode display taken along the line A-A of FIG. 1 according to the third embodiment, and FIG. 7 illustrates a schematic flowchart of a manufacturing method according to the third embodiment.

A structure of one pixel according to the third embodiment may be the same as that of the first embodiment, and the switching transistor $T_{SW}$ and the capacitor $C_{SN}$ of the sensor SN according to the third embodiment may be the same as those of the first embodiment. According to the third embodiment, a sensor insulating layer (SIL) 130 may be further formed on the buffer layer 115 and the gate insulating layer 140. The sensor insulating layer 130 may be formed of an inorganic material, and may be formed as a monolayer or a multilayer.

The light sensing element $S_{PH}$ according to the present embodiment may be different from that of the first embodiment in the position of the active layer and the formation material of the gate electrode. The third embodiment will be described based on the difference from the first embodiment, and elements of the second embodiment that are not mentioned herein may be the same as those of the first embodiment.

The buffer layer 115 may be formed on the lower substrate 110, and an active layer 150e of the light sensing element $S_{PH}$ may be formed on the buffer layer 115. The sensor insulating layer 130 may be formed on the active layer 150e, and the gate electrode 124e (of the light sensing element $S_{PH}$), the polycrystalline semiconductor layers 150a and 150b (of the driving and switching transistor $T_{DR}$ and $T_{SW}$), and the lower capacitor electrodes 155a and 155b may be formed at or on a same layer on the sensor insulating layer 130. For example, the gate electrode 124e may be substantially coplanar with the polycrystalline semiconductor layers 150a and 150b (of the driving and switching transistor $T_{DR}$ and $T_{SW}$) and the lower capacitor electrodes 155a and 155b. The gate electrode 124e and the lower capacitor electrodes 155a and 155b may be formed of a doped polycrystalline semiconductor to have the conductor characteristic.

The gate insulating layer 140, the interlayer insulating layer 180, and the passivation layer 185 may be sequentially formed on the gate electrode 124e, and the filter layer 187 may be formed on the passivation layer 185 to be overlapped with or overlie the gate electrode 124e and the active layer 150e. Contact holes (for exposing opposite edges of the active layer 150e) may be formed in the passivation layer 185, the interlayer insulating layer 180, the gate insulating layer 140, and the sensor insulating layer 130. Source and drain electrodes 173e and 175e may be formed on the passivation layer 185, and may respectively contact the opposite edges of the active layer 150e through the contact holes. The drain electrode 175e may be connected to the source electrode 173b of the switching transistor $T_{SW}$ through the contact holes formed in the passivation layer 185. The source electrode 173e and the drain electrode 175e may be disposed at or on a same layer as the pixel electrode 190 by using the same material as the pixel electrode 190. For example, the source electrode 173e and the drain electrode 175e may be substantially coplanar with the pixel electrode 190 (e.g., horizontally planar portions of source electrode 173e and the drain electrode 175e may be substantially coplanar with horizontally planar portions of the pixel electrode 190, as shown in FIG. 6)

The light sensing element according to the third embodiment may have a top-gate structure in which a gate electrode 124e is disposed above or overlies the active layer 150e. However, the gate electrode 124e may be optically transparently formed by using a doped semiconductor, and light passing through the filter layer 187 may be introduced into the active layer 150e through the gate electrode 124e.

A manufacturing method according to the present embodiment will be described. A step for forming the active layer 150e of the light sensing element $S_{PH}$ may be executed after the buffer layer 115 is formed on the lower substrate 110. Then, the sensor insulating layer 130 may be formed to insulate the active layer 150e from the gate electrode 124e that is overlapped with or that overlies the active layer 150e. Next, the polycrystalline semiconductor layers 150a and 150b, the lower capacitor electrodes 155a and 155b, and the gate electrode 124e may be formed.

Next, the gate insulating layer 140 may be formed, and then the gate electrodes 124a and 124b of the driving and switching transistors $T_{DR}$ and $T_{SW}$ and the upper electrodes 125a and 125b of the capacitors $C_{PX}$ and $C_{SN}$ may be formed. Next, the interlayer insulating layer 180 and the contact holes may be formed, and then the source electrodes 173a and 173b and the drain electrodes 175a and 175b of the driving and switching transistors $T_{DR}$ and $T_{SW}$ may be formed. The following steps according to the present embodiment may be the same as those of the first embodiment. However, the active layer 150e may be disposed below the sensor insulating layer 130, and contact holes for bringing the source and drain electrode 173e and 175e into contact with the active layer 150e may be formed to extend through the passivation layer 185, the interlayer insulating layer 180, the gate insulating layer 140, and the sensor insulating layer 130.

A fourth embodiment will be described with reference to FIG. 8 and FIG. 9.

Figure 8:
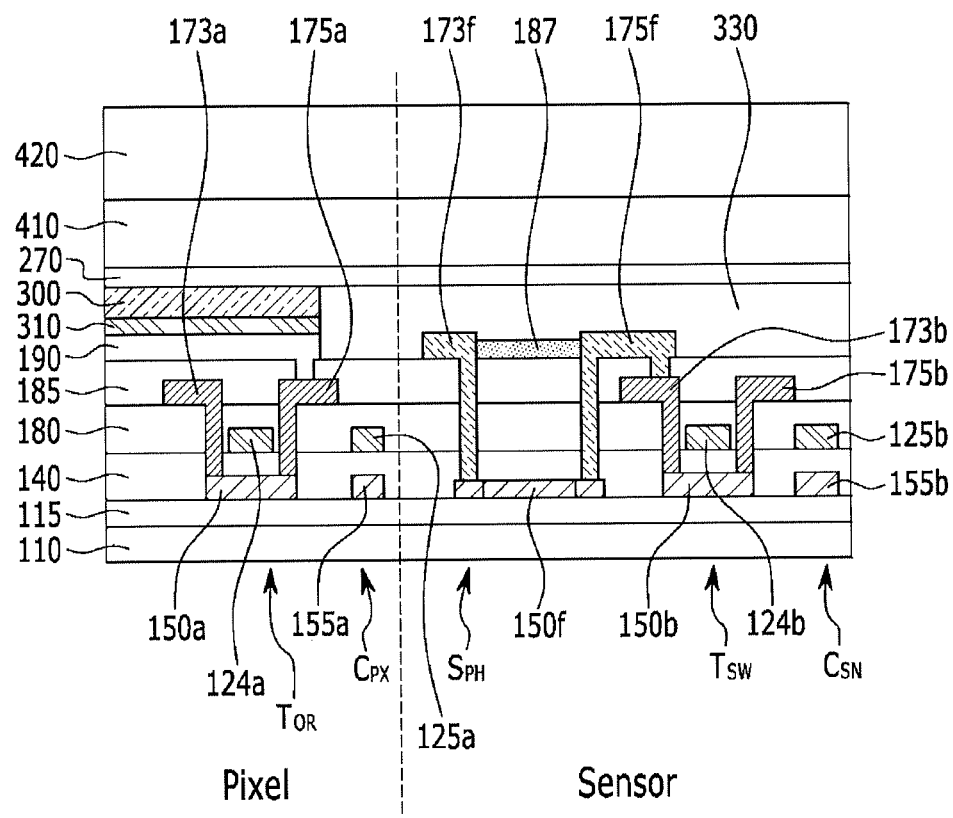
FIG. 8 illustrates a cross-sectional view of the organic light emitting diode display taken along the line A-A of FIG. 1 according to a fourth embodiment.
Figure 9:
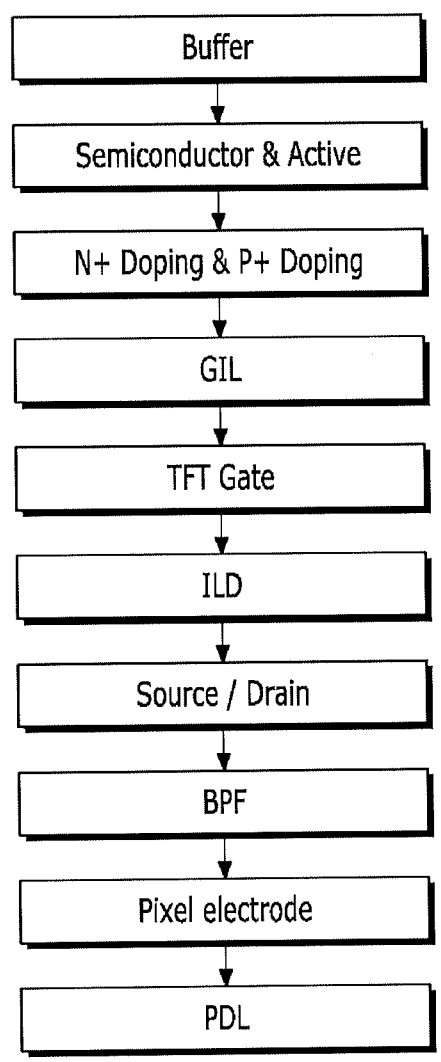
FIG. 9 illustrates a schematic flowchart of a manufacturing method according to the fourth embodiment.

FIG. 8 illustrates a cross-sectional view of the organic light emitting diode display taken along the line A-A of FIG. 1 according to the fourth embodiment, and FIG. 9 illustrates a schematic flowchart of a manufacturing method according to the fourth embodiment.

A structure of one pixel according to the fourth embodiment may be the same as that of the first embodiment, and the switching transistor $T_{SW}$ and the capacitor $C_{SN}$ of the sensor SN according to the fourth embodiment may be the same as those of the first embodiment. However, the light sensing element $S_{PH}$ of the organic light emitting diode display according to the first embodiment has a transistor structure, while the light sensing element $S_{PH}$ of the organic light emitting diode display according to the fourth embodiment has a diode structure. Accordingly, the light sensing element $S_{PH}$ of the present embodiment may not include gate electrode, and opposite edges of the active layer 150f may be respectively doped with an n-type and a p-type. As a result, an active layer 150f may include an intrinsic semiconductor region, and an n-type semiconductor region and a p-type semiconductor region that are respectively disposed at opposite ends thereof. The active layer 150f may be formed of silicon, a silicon compound, an oxide semiconductor, or the like.

A first electrode 173f and a second electrode 175f (that are formed at or on a same layer on the passivation layer 185) may be respectively connected to the n-type semiconductor region and the n-type semiconductor region through the contact holes that are formed to extend through the passivation layer 185, the interlayer insulating layer 145, and the gate insulating layer 140. The second electrode 175f may be connected to the source electrode 173b of the switching device through the contact hole formed on the passivation layer 185.

In a manufacturing method of the present embodiment, the active layer 150f of the light sensing element $S_{PH}$ may be formed when the polycrystalline semiconductor layers 150a and 150b of the driving and switching transistors $T_{DR}$ and $T_{SW}$ and the lower capacitor electrodes 155a and 155b of the capacitors $C_{PX}$ and $C_{SN}$ are formed after the buffer layer 115 is formed on the lower substrate 110. However, the opposite edges of the active layer 150f may be respectively doped with different types of impurities, and an ion doping process may be performed two times.

Hereinafter, a circuit of the sensor including the light sensing element $S_{PH}$, the switching transistor $T_{SW}$, and the capacitor $C_{SN}$ and an operation thereof will be described with reference to FIG. 10 and FIG. 11.

Figure 10:
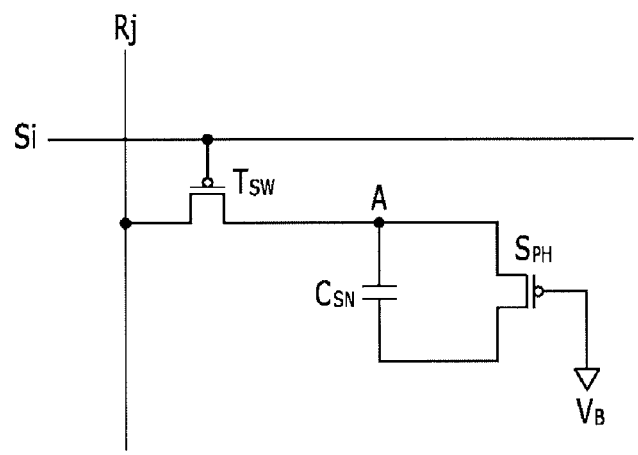
FIG. 10 illustrates a circuit diagram of the sensor according to the first to third embodiments.
Figure 11:
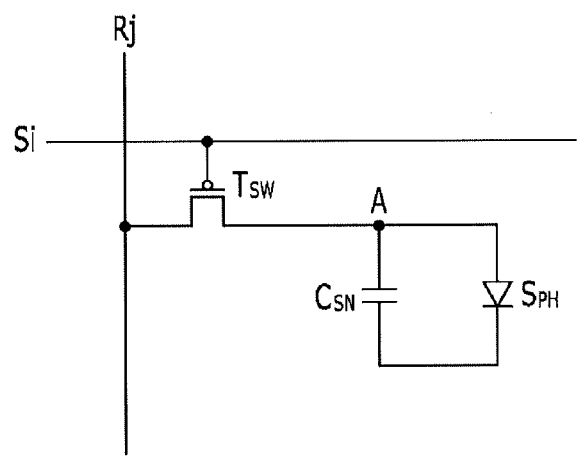
FIG. 11 illustrates a circuit diagram of the sensor according to the fourth embodiment.

FIG. 10 illustrates a circuit diagram of the sensor according to the first to third embodiments, and FIG. 11 illustrates a circuit diagram of the sensor according to the fourth embodiment.

Referring to FIG. 10, the gate electrode of the switching transistor $T_{SW}$ may be connected to a scan line Si, and the drain electrode thereof may be connected to a read-out line Rj. At a node "A," the source electrode of the switching transistor $T_{SW}$ may be connected to the drain electrode of the light sensing element $S_{PH}$ and the first electrode of the capacitor $C_{SN}$. The source electrode of the light sensing element $S_{PH}$ may be connected to the second electrode of the capacitor $C_{SN}$, and a bias voltage $V_B$ may be applied to the gate electrode. In an implementation, the bias voltage $V_B$ that is applied to the gate electrode of the light sensing element $S_{PH}$ may be applied to the second electrode of the capacitor $C_{SN}$ and the source electrode of the light sensing element $S_{PH}$, or a bias having different magnitude may be applied thereto.

When light (such as infrared rays) is introduced into the active layer through the filter layer of the light sensing element $S_{PH}$, a current may be generated. The generated current may be used to charge the capacitor $C_{SN}$. When the switching transistor $T_{SW}$ is turned on according to a control signal that is inputted through a scan line Si, a signal that is varied depending on a charge amount charged for the capacitor $C_{SN}$, may be transmitted to a signal processor (not shown) through the switching transistor $T_{SW}$ and the read-out line Rj that is connected thereto. Then, the signal processor may determine whether an object is touched, at which position the touch is performed, and the like based on the received signal. In an implementation, determination of whether an object is touched, at which position the touch is performed, and the like may be performed by charging the capacitor $C_{SN}$ with a reference voltage at the node A and then reading out the voltage of the node A that is varied depending on the charge amount discharged through the light sensing element $S_{PH}$ according to the intensity of light introduced into the light sensing element $S_{pH}$. In the meantime, it is possible to control an appropriate leakage level by applying the bias voltage $V_B$ to the gate electrode of the light sensing element $S_{PH}$.

Referring to FIG. 11, the gate electrode of the switching transistor $T_{SW}$ may be connected to the scan line Si, and the drain electrode thereof may be connected to the read-out line Rj. At a node "A," the source electrode of the switching transistor $T_{SW}$ may be connected to the anode electrode of the light sensing element $S_{PH}$ and the first electrode of the capacitor $C_{SN}$. The cathode of the light sensing element $S_{PH}$ may be connected to the second electrode of the capacitor $C_{SN}$. The connection direction of the anode and cathode electrodes of light sensing element $S_{PH}$ may be changed.

An operation of one sensor according to fourth embodiment may be formed to be substantially the same as described above. However, no gate electrode may be provided, and no gate biasing may be performed. Accordingly, the operation of the sensor may be affected by an external field.

By way of summation and review, the organic light emitting diode display may be bendably manufactured by using a plastic substrate, and may include a touch function for sensing a touch. For example, in a flexible organic light emitting diode display, a thin film encapsulation layer may be stacked to protect internal elements, instead of an encapsulation layer made of a material such as glass. This may present difficulties in forming a sensor for sensing a touch or the like. A photo sensor for sensing infrared rays or the like may be used as a sensor for sensing object presence, touch, position, shape, or the like.

The organic light emitting diode display according to an embodiment may include sensors. For example, elements of the sensor may be formed on the lower substrate on which the thin film transistor of the pixel is formed. For example, it may be useful to form the elements of the sensor on the lower substrate in a flexible organic light emitting diode display (in which it may be difficult to include an additional upper substrate). Further, such an embedded sensor may be formed by merely adding one sheet of mask for an active layer of the light sensing element to a manufacturing process of a typical organic light emitting diode display.

In an implementation, the active layer of the light sensing element may be formed after the polycrystalline semiconductor layer of the thin film transistor, and the active layer may not be affected by a high-temperature process such as a dehydrogenation process and a crystallization process, thereby preventing degradation of the active layer in the manufacturing process.

Further, the organic light emitting diode display may be a self-emitting type of display device, and it may not be necessary to form a layer for blocking light emitted from a rear surface of the display panel below the light sensing element, unlike a liquid crystal display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| | |
|---|---|
| 110: lower substrate | 115: buffer layer |
| 124a, 124b, 124c, 124d, 124e: gate electrode | |
| 125a, 125b: upper capacitor electrode | 130: sensor insulating layer |
| 140: gate insulating layer | 145: interlayer insulating layer |
| 150a, 150b: polycrystalline semiconductor layer | 150c, 150d, 150e, 150f: active layer |
| 155a, 155b: lower capacitor electrode | 173a, 173b, 173c, 173d, 173e: source electrode |
| 173f: first electrode | 175a, 175b, 175c, 175d, 175e: drain electrode |
| 175f: second electrode | 180: interlayer insulating layer |
| 185: passivation layer | 187: filter layer |
| 190: pixel electrode | 270: common electrode |
| 300: organic light emitting layer | 310: infrared emitting layer |
| 330: pixel defining layer | 410: capping layer |
| 420: encapsulation layer | $C_{PX}$: pixel capacitor |
| $C_{SN}$: sensor capacitor | $S_{PH}$: light sensing element |
| $T_{DR}$: driving transistor | $T_{SW}$: switching transistor |

What is claimed is:

1. An organic light emitting diode display, comprising:
   a pixel that includes a light-emitting device and a first thin film transistor connected to the light-emitting device; and
   a sensor that includes a light sensing element,
   wherein:
   the light sensing element includes:
      a gate electrode;
      an active layer on the gate electrode;
      a filter layer on the active layer; and
      source and drain electrodes on the active layer, the source and drain electrodes being connected to the active layer,
   the light sensing element and the first thin film transistor are formed on a same substrate, and
   one of the gate electrode and the active layer of the light sensing element and a gate electrode of the first thin film transistor are aligned on a same layer.

2. The organic light emitting diode display as claimed in claim 1, wherein:
   the first thin film transistor includes:
      a polycrystalline semiconductor layer on the substrate;
      the gate electrode on the polycrystalline semiconductor layer; and
      source and drain electrodes on the gate electrode, the source and drain electrodes being connected to the polycrystalline semiconductor layer, and the light-emitting device includes:
- a pixel electrode overlying the source and drain electrodes and connected to one of the source and drain electrodes;
- an organic light emitting layer on the pixel electrode; and
- a common electrode on the organic light emitting layer.

3. The organic light emitting diode display as claimed in claim 2, wherein the source and drain electrodes of the light sensing element:
- are aligned on a same layer as the pixel electrode of the light-emitting device, and
- are formed of a same material as the pixel electrode.

4. The organic light emitting diode display as claimed in claim 3, wherein the filter layer and the source and drain electrodes of the light sensing element are aligned on a same layer.

5. The organic light emitting diode display as claimed in claim 2, wherein the gate electrode of the light sensing element:
- is aligned on a same layer as the gate electrode of the first thin film transistor, and
- is formed of a same material as the gate electrode of the first thin film transistor.

6. The organic light emitting diode display as claimed in claim 5, wherein the active layer of the light sensing element is aligned on a same layer as the source and drain electrodes of the first thin film transistor.

7. The organic light emitting diode display as claimed in claim 2, wherein the gate electrode of the light sensing element:
- is aligned on a same layer as the polycrystalline semiconductor layer, and
- is formed of a doped polycrystalline semiconductor.

8. The organic light emitting diode display as claimed in claim 7, wherein the active layer of the light sensing element is aligned on a same layer as the gate electrode of the first thin film transistor.

9. The organic light emitting diode display as claimed in claim 2, wherein the light-emitting device further includes an infrared emitting layer between the pixel electrode and the organic light emitting layer.

10. The organic light emitting diode display as claimed in claim 2, wherein:
- the sensor further includes a second thin film transistor that includes source and drain electrodes, and
- one of the source and drain electrodes of the second thin film transistor is connected to one of the source and drain electrodes of the light sensing element.

11. The organic light emitting diode display as claimed in claim 2, wherein:
- the sensor further includes a capacitor that includes a first electrode and a second electrode,
- the first electrode of the capacitor is aligned on a same layer as the semiconductor layer of the first thin film transistor and is formed of a doped semiconductor, and
- the second electrode of the capacitor is aligned on a same layer as the gate electrode of the first thin film transistor and is formed of the same material as the gate electrode of the first thin film transistor.

12. The organic light emitting diode display as claimed in claim 1, wherein the filter layer includes a band-pass filter containing one of poly(methyl methacrylate), polycarbonate, and polyimide.

* * * * *